(12) United States Patent
Page

(10) Patent No.: US 7,804,887 B2
(45) Date of Patent: *Sep. 28, 2010

(54) ULTRA-NARROW BANDWIDTH RADIO FREQUENCY COMMUNICATIONS LINK

(75) Inventor: Edward A. Page, Kensington, MD (US)

(73) Assignee: Applied Research Associates, Inc., Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/615,553

(22) Filed: Nov. 10, 2009

(65) Prior Publication Data

US 2010/0067610 A1    Mar. 18, 2010

Related U.S. Application Data

(63) Continuation of application No. 11/370,784, filed on Mar. 8, 2006, now Pat. No. 7,639,734.

(60) Provisional application No. 60/659,068, filed on Mar. 8, 2005.

(51) Int. Cl.
*H04B 1/38* (2006.01)

(52) U.S. Cl. .................. 375/219; 375/151; 375/153; 375/295; 375/316; 455/423; 455/73; 455/86; 455/334; 342/357.02; 342/19

(58) Field of Classification Search ............. 375/219, 375/151, 153, 295; 455/423, 73, 86
See application file for complete search history.

(56) References Cited

U.S. PATENT DOCUMENTS

| | | | |
|---|---|---|---|
| 5,581,229 A | 12/1996 | Hunt | |
| 5,657,326 A | 8/1997 | Burns et al. | |
| 7,197,089 B2 | 3/2007 | Najarian | |
| 7,250,899 B2 | 7/2007 | Smith et al. | |
| 7,447,252 B2 | 11/2008 | Partyka | |
| 7,639,734 B2 * | 12/2009 | Page | 375/219 |
| 2005/0136880 A1 | 6/2005 | Subasic et al. | |
| 2007/0008215 A1 | 1/2007 | Smith et al. | |

OTHER PUBLICATIONS

Schmalkoke, Peter, "Multidimensional EM field analysis and representation", May 2001, pp. 1-6, retrieved from the internet: URL:http://www.vlf.it/rdfatvlf/rdfatvlf.htm.> [retrieved on Jul. 3, 2006].

(Continued)

*Primary Examiner*—Sudhanshu C Pathak
(74) *Attorney, Agent, or Firm*—Dinsmore & Shohl LLP; Monika J. Hussell

(57) ABSTRACT

The present invention is a dramatically enhanced RF link for low-data-rate applications (1-100 bps), using one or more transmitters to communicate with one or more receivers, at dramatically enhanced ranges. The receiver of the present invention can rapidly search, detect, and lock in on narrow band signal transmissions, that may be present in a much larger frequency band and which may be changing frequency during the duration of the message. These receivers enable ultra-low noise floor detection of longer range, more highly attenuated, signal transmissions, by decreasing the receiver bandwidth.

18 Claims, 9 Drawing Sheets

OTHER PUBLICATIONS

Wan-Thai Hsu, et al, "Stiffness-Compensted Temperature-Insensitive Micromechanicial Resonators", IEEE, US, vol. Conf 15, 2002, pp. 731-734.

Levin, V.A.; Norkin, G.A., "Radio engineering filtering systems with reverse heterodyning", 1979, Moscow, Izdatel'stvo Sovetskoe Radio, p. 272, Retrieved from the Internet {http://adsabs/harvard.edu/cgi-bin/nph-bib_query?bibcode=1979MlzSR....Q....L&db_key=PHY}.

* cited by examiner

FIG. 3A  SAW Resonator Based Version

FIG. 3B  SAW Resonator with PLL Base

Detection & Tracking of Ultra-Narrow Bandwidth Messages in the Frequency – Time Domain Using Dynamic Programming Methods

FIG. 9

**Seeking Maximum Sum Path in this *Data Matrix***

| 0 | 1 | 2 | 3 | 2 | 1 |
|---|---|---|---|---|---|
| 3 | 1 | 2 | 1 | 3 | 1 |
| 2 | 2 | 1 | 2 | 1 | 1 |
| 2 | 1 | 2 | 3 | 1 | 1 |
| 1 | 0 | 2 | 2 | 1 | 2 |
| 2 | 0 | 3 | 2 | 2 | 0 |
| 2 | 0 | 1 | 2 | 2 | 1 |

Merit Matrix Resulting From Localized Computations in Data Matrix

| 14 (1) | 15 (1) | 16 (3) | 18 (5) | 17 (5) | 16 (5) |
|---|---|---|---|---|---|
| 14 (2) | 12 (2) | 14 (4) | 13 (4) | 15 (4) | 12 (5) |
| 10 (2) | 11 (3) | 11 (4) | 12 (4) | 11 (4) | 9 (5) |
| 7 (1) | 8 (3) | 9 (3) | 10 (4) | 8 (4) | 7 (5) |
| 5 (1) | 5 (3) | 7 (3) | 7 (3) | 5 (5) | 4 (4) |
| 4 (1) | 2 (1) | 5 (4) | 4 (4) | 4 (5) | 3 (5) |
| 2 | 0 | 1 | 2 | 2 | 1 |

To Determine Signal to Noise of Solution, Repeat Process Using Randomized Versions of the Data Matrix to Obtain Statistics.

NOTE: The Computation Time For Detecting & Tracking The Maximum Sum Route For All Paths Starting At Any Of The 400 Frequency Bins & Proceeding Through 200 Time Intervals, With A Max Of One Frequency Bin Shift Per Time Interval, is about 5 ms using a midrange DSP processor

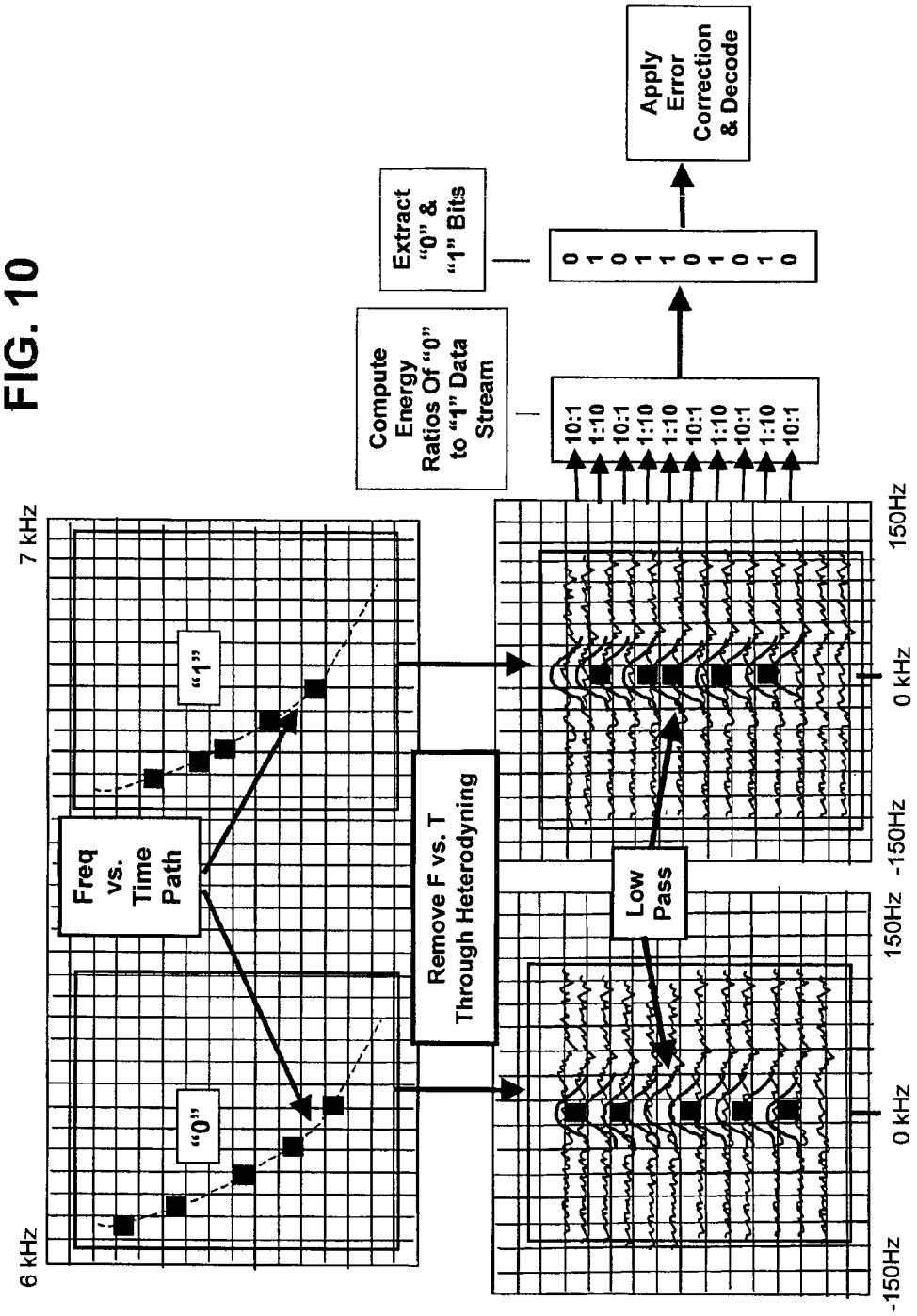

ULTRA-NARROW BANDWIDTH RADIO FREQUENCY COMMUNICATIONS LINK

CROSS REFERENCE TO RELATED APPLICATIONS

This application is a continuation of U.S. application Ser. No. 11/370,784, filed Mar. 8, 2006, which itself claims the benefit of priority of U.S. Provisional Application Ser. No. 60/659,068 filed Mar. 8, 2005.

This invention addresses an innovative radio frequency (RF) link, including at least one transmitter and at least one receiver, that provides a practical means for small, low cost, battery powered devices to transmit signals in the higher frequency ranges (>0.5 GHz), using ultra-narrow RF bandwidths (1-100 Hz). These ultra-narrow bandwidths allow dramatically longer propagation ranges than is possible using currently available technology operating at the same power and frequency, and also provides a practical means to receive numerous messages simultaneously over a large dynamic range (>50 dB). It is known that operating at ultra-narrow bandwidths is not a problem provided the signal is transmitted at lower frequencies (e.g., 1 MHz); however, carrier instability increases proportional to the increase in transmitting frequency, becoming hundreds to thousands of Hz when transmitting frequencies exceed 0.5 GHz, making it impossible to operate in a practical and effective way using receivers having narrow bandwidths such as 10 Hz. These carrier instabilities result from processes at both the transmitter and receiver ends of the link, and over the propagation path including: temperature offset, temperature variability, vibration induced frequency variations, and Doppler effects.

Currently available RF link receivers utilize designs in which the fixed receiver BW is sufficiently large (10 kHz to >100 kHz) to encompass these carrier instabilities as well as higher rate communications, and therefore do not have a problem operating with such instabilities; however, they do not achieve enhanced performance, even when the transmission bandwidth is lowered since the fixed receiver detection bandwidth is too large and the resulting receiver noise floor too high.

The present invention provides a means to enhance RF link propagation margins (the amount a signal can be attenuated and still be detected) for communication applications in which low data rates (e.g. 1-100 bps) are sufficient. This capability is primarily achieved through signal processing, incorporated in the receiver, which can detect and extract transmitted messages using a BW much narrower than the large, unpredictable, carrier frequency variations, which can also change the transmitter carrier frequency of the message during the time throughout the duration of the message. A much narrower receiver detection BW results in a proportionally lower detection noise floor, typically by 30-40 dB, which allows an increase in propagation range that can be approximately characterized as ×100 in free space, ×10 on ground-to-ground links, and ×5 through building structures, relative to currently available technology.

Additional benefits of the present invention, which derive from its ability to achieve very low receiver detection noise floors (e.g., -150 dBm) include receiving and processing multiple simultaneous messages over a large dynamic range (>50 dB); intrinsic low probability of intercept and anti-jamming capability. Furthermore, the preferred components and designs of the transmitter and receiver of the RF link of the present invention as described herein are relatively inexpensive and compact.

This technology is suitable for applications in which it is desired to transmit relatively short messages over longer ranges then currently possible, using compact, low power, and inexpensive transmitters.

The initial motivation for this invention related to achieving an RF link capable of directly transmitting relatively short messages throughout large industrial plants, typically having highly obstructed RF propagation paths. A key requirement for this application was that large numbers of low cost, battery powered, compact (e.g. 1 inch$^3$) devices were required to transmit in excess of 1000' in this highly attenuating multipath environment, and the receiver was required to simultaneously receive and process multiple messages.

What was desired was an RF link, operating in the 1.0-2.4 GHz range, with a link BW less than 200 Hz. No currently available technology could meet these requirements since the best practical temperature compensated oscillators (e.g. the oven stabilized versions are not practical with their high power requirements) had a frequency drift of ±2.5 ppm×2400 MHz, resulting in a ±6 kHz variation over an outdoor temperature range. In addition, the oscillator frequency is known to drift hundreds to thousands of Hz soon after power-up; vibration induced affects on the crystal can cause several hundreds of Hz variations; and the source/receiver (e.g., receiver operating in an aircraft) and obstacle induced Doppler effects could result in variations of hundreds to thousands of Hz.

Other applications which would greatly benefit from the technology of the present invention include remotely deployed unattended sensors for military surveillance and targeting; perimeter security; automatic soldier status reporting; world wide satellite tracking of sensitive materials; monitoring borders; machine status reporting in industrial plants and commercial facilities; individual health and activity monitoring devices; agricultural reporting of environmental conditions; and remote monitoring of critical structures such as bridges and dams. This is not intended as an exclusive list of applications, but rather as a sampling of the same.

When Bluetooth transceivers became available it appeared as a possible solution since they were inexpensive, reliable, compact, and could handle the simultaneous multiple message reception. However, their direct transmission range (even with an 80 mW power amplifier) was very limited in this environment (the networking option, in which daisy chains of transceivers, each requiring external power, are installed to step the messages through the industrial plant, for example, was rejected for this application because of its complexity), and they are designed with a receiver BW of about 1 MHz, which allowed for a data rate of about 100,000 times what was required for the industrial application. This resulted in a noise floor 50 dB higher than necessary, which dramatically limits the propagation range.

Readily available RF link chipset providers such as TI, Motorola, Linx, and Ember, operate at >500 MHz carriers, and typically utilize BWs in excess of 80 kHz. Many of these RF links are capable of low data rate transmission, but it does not follow that the receiver bandwidth can be reduced in turn, which is required to achieve the propagation benefits of the low rate. A phase-lock-loop (PLL) would appear to be a natural solution to this problem, in that it can seek and lock-in on such a signal; however, it would have to dwell for at least 0.3 seconds (to achieve a 10 Hz loop BW), at each possible frequency, requiring more than 2 minutes to search the minimum frequency range anticipated for the applications discussed above. Furthermore, the loop would have trouble staying locked onto the intrinsically unstable frequency (resulting from a combination of oscillator phase noise experienced when modulating extremely close to the carrier frequency and other sources of frequency instability), and would not allow for simultaneous extraction of multiple messages over a large dynamic range.

Other approaches to increasing RF link range for a given power level include use of highly directional antennas, cryogenic cooling, oven-stabilized crystal oscillators, improved modulation, and enhanced error correction methods. These approaches are either impractical or result in only modest increases in signal direction (the antennas are too large; cryogenic cooling requires liquid helium and thermal isolated vessels, which must be refilled periodically; oven oscillators require about 1 watt of power; improved modulation involves substantial complexity with insufficient gain (6 dB); and error correction, beyond that described herein, requires additional complexity and additional message length), for the compact, low cost, low power applications addressed by the present invention.

SUMMARY OF THE INVENTION

The objective of the present invention is to dramatically enhance the performance of an RF link for low-data-rate applications (1-100 bps), using one or more compact and inexpensive transmitters to communicate with one or more receivers, at dramatically enhanced ranges. The receiver of the present invention can rapidly search, detect, and lock in on narrow band signal transmissions, that may be present in a much larger frequency band and which may be changing frequency during the duration of the message. These receivers enable ultra-low noise floor detection of longer range, more highly attenuated, signal transmissions.

The following description of the invention and specific embodiments thereof can be best understood when read in conjunction with the following drawings, in which:

FIG. 9 is an example of a signal detected and tracked in accordance with the present invention, using dynamic programming methods.

FIG. 10 shows manipulation of a signal, and extracting the message therefrom, in accordance with an embodiment of the present invention.

TRANSMITTER

Figure 1:
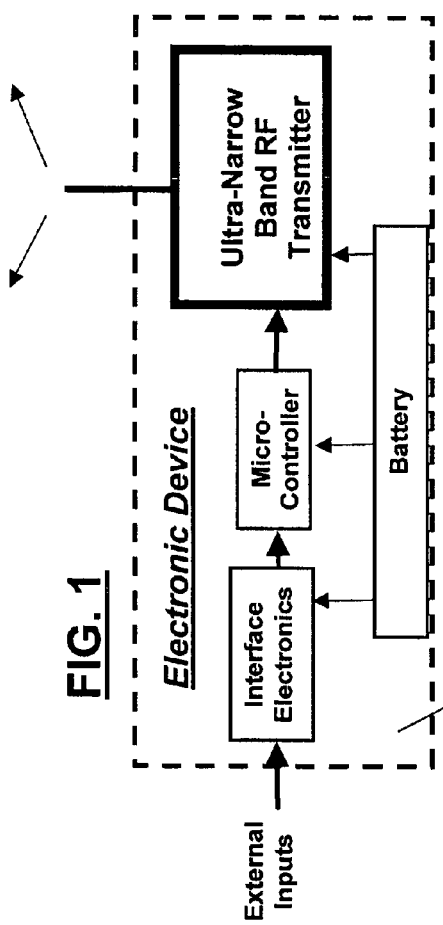
FIG. 1 is a depiction of an electronic device, including a transmitter, suitable for use in the present invention.
Figure 2:
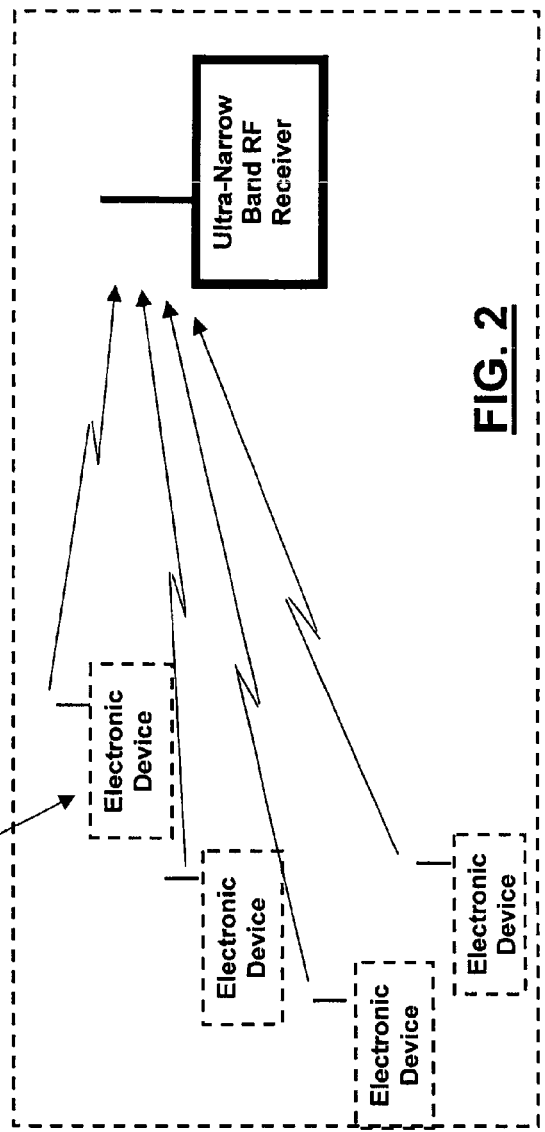
FIG. 2 is a depiction of an embodiment of the system of the present invention, including multiple electronic devices designed and configured to input messages to a single, ultra-narrow bandwidth receiver.

As depicted in FIG. 1, the transmitter used in the RF link of the present invention can be part of, or is otherwise associated with, an electronic device that will generate and send the message data to the transmitter. This data can originate from data stored in the device, data directly acquired by the device, or data derived from processing externally acquired information through analog or digital processing means within the device. In many cases the processor of the electronic device can be shared with the transmitter to perform processing, generation of the message to be transmitted, control of the transmitter through digital-to-analog outputs, and reception of analog-to-digital converted inputs to enhance the stability of the transmitter carrier frequency.

The basic transmitter comprises a microprocessor (which, at a minimum, forms a message for the transmitter electronics to send, including computing and incorporating error detection and correction bits, and performs the functions of controlling the transmitter) and an oscillator and amplifier, preferably a crystal stabilized SAW oscillator (which reduces phase noise of the oscillator close to the carrier, and carrier frequency drift due to temperature instability), to produce the message signal transmitted to the receiver. The transmitter may include signal modulations, such as amplitude modulations (OOK) or frequency shift modulations (FSK), both of which are incoherent and rely on the receiver detecting the energy of the received bits rather than phase related information; FSK modulation has the added advantage in that it is based on the ratio of power with the "O" and "1" bit exceeding a threshold, and therefore does not require a background-trained threshold required by the OOK. A crystal stabilized SAW oscillator contains a varactor (a voltage controlled capacitor), which is controlled by the digital/analog outputs of the microcontroller to generate the OOK or FSK required for the RF transmission.

Figure 4:
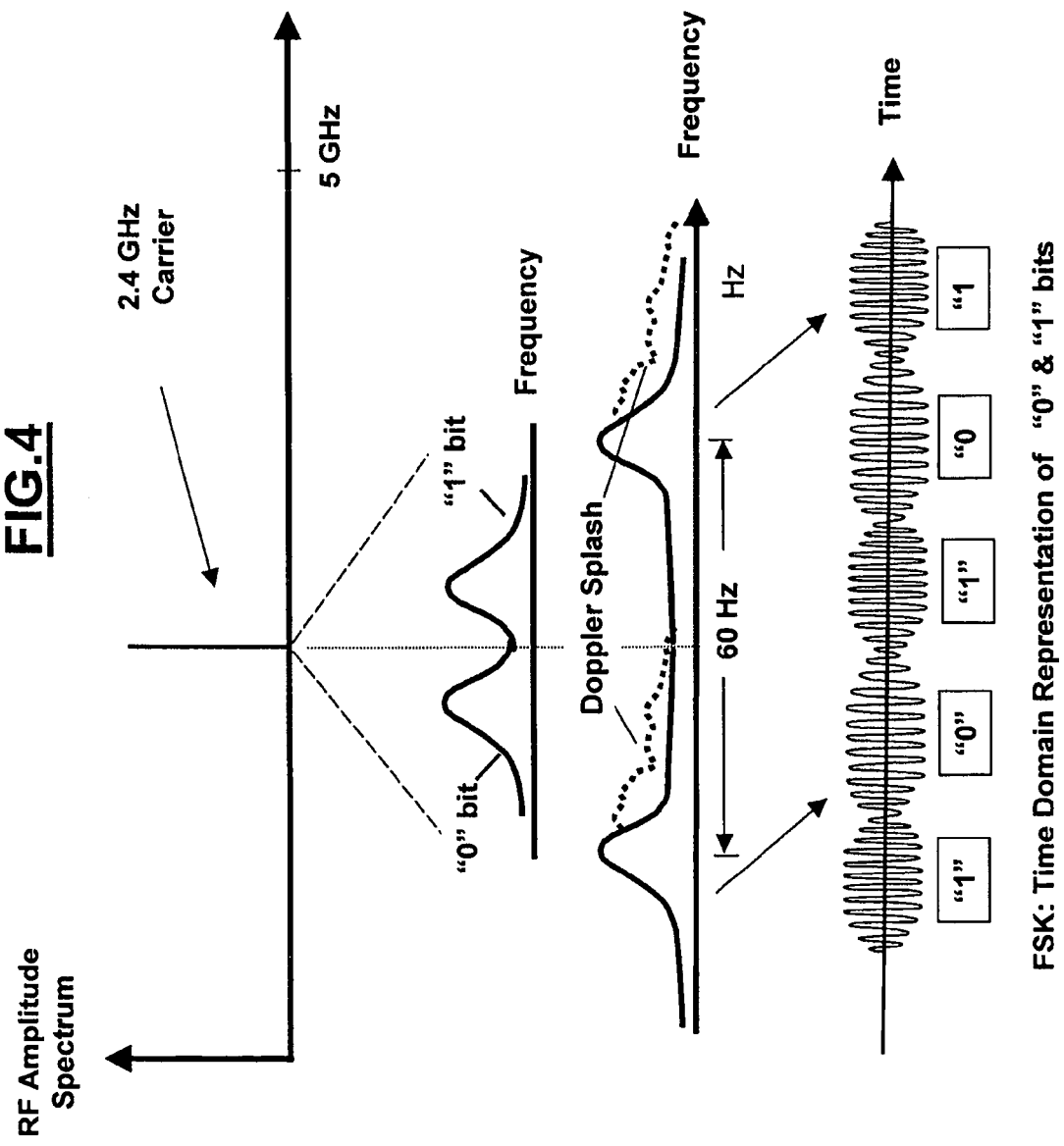
FIG. 4 illustrates the FSK transmission of a digital message as hereinafter described.

FIG. 4 illustrates the FSK transmission of a digital message. Shown is a 2.4 GHz carrier frequency which is shifted by +30 Hz in this example for transmission of a "1" bit, or −30 Hz for transmission of a "0" bit. In FSK modulation, the "0" and "1" bits are transmitted as short bursts of different frequencies separated sufficiently to accommodate the bandwidth of the bits transmitted, and to eliminate errors caused by interference (such as a Doppler shift) where energy at the "O" bit frequency is reduced and shifted to the "1" bit frequency (shown in the frequency domain of the middle trace). In the first trace, an example using closely spaced frequencies is illustrated. The middle trace gives the same with a frequency separation of 60 Hz, and has lobe widths of approximately 10 Hz, which can accommodate bps rate of $\geqq 5$ Hz (also showing the Doppler shift spreading of the bit energy). The bottom trace in the figure illustrates the transmitted waveforms in the time domain.

Figure 3:
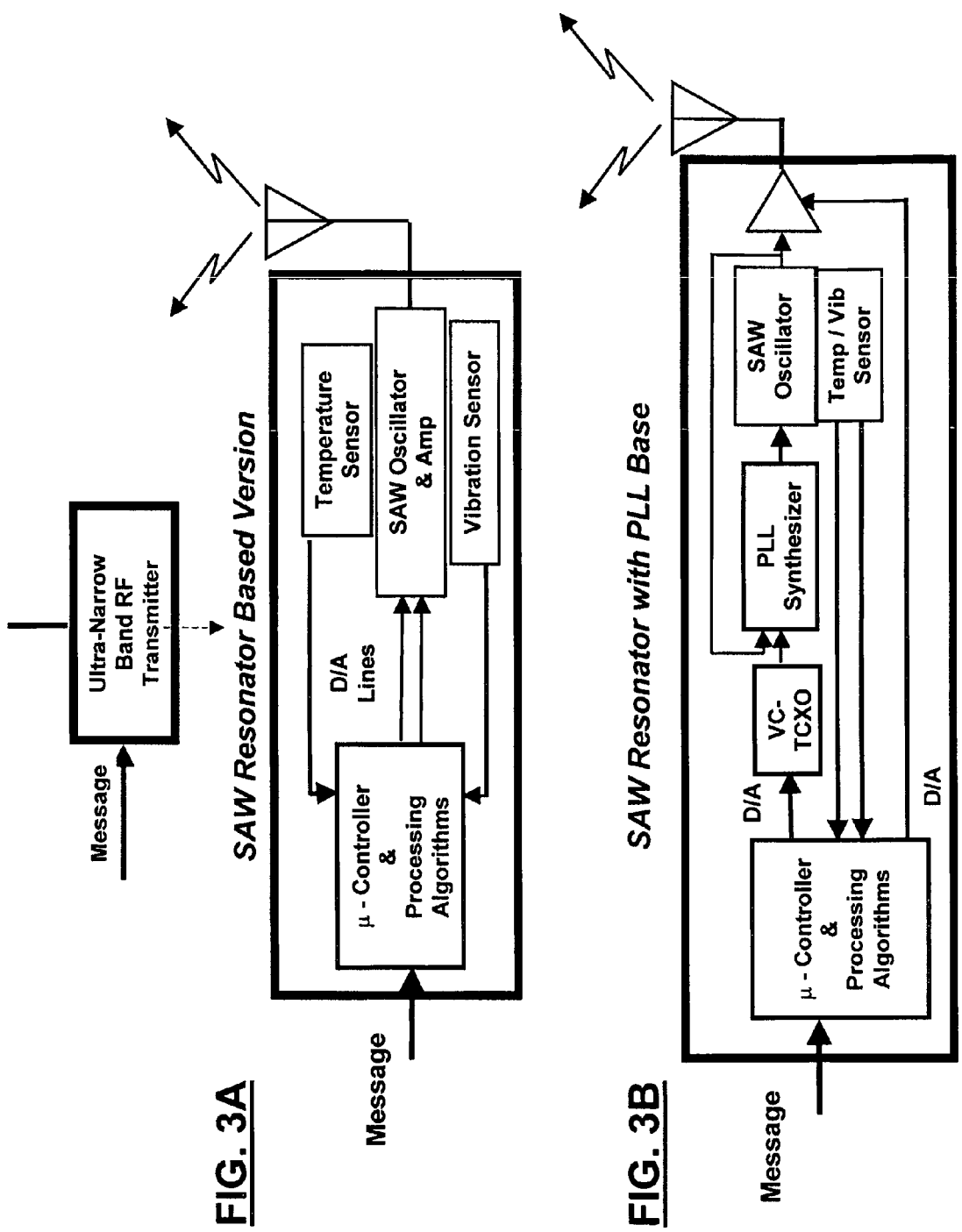
FIGS. 3A and 3B are depictions of embodiments of the transmitter suitable for use in the present invention.

The design of a preferred embodiment for the transmitter using a SAW oscillator and an amplifier is illustrated in FIG. 3A. This embodiment is very low cost, compact, and will achieve good performance down to bps rates of less than 10; typically, the components of this transmitter are readily available in the 915 MHz and 2400 MHz carrier frequency range. As shown in this figure, the digital signal of the message is input to the microcontroller of the transmitter, converted to an analog signal, and outputs therefrom are used to control the oscillator frequency (through the varactor) and the amplifier gain, respectively.

Because vibration of the oscillator (or in the receiver) may cause frequency instability, a micro electro-mechanical system (MEMS) accelerometer may be incorporated into the transmitter design to measure vibration of the device. Measurements from the accelerometer may then be sent to the microcontroller, which can determine the necessary frequency change required to reduce frequency instability caused by the vibration, through real time frequency corrections transmitted directly to the varactor. The frequency change necessitated by the vibration may be based upon a transfer function, which may be unique for each transmitter unit, and therefore is individually determined during the manufacturing process of a transmitter. Published data on performing such vibration compensation indicates the reduction in frequency instability to be around 90%.

Furthermore, SAW oscillators have relatively high levels of frequency drift induced by temperature changes (e.g., ±100 ppm over the −30° to +90° C. range), and therefore the transmitter design may incorporate a means to reduce temperature induced frequency variations. Such means may include, for example and as shown in FIGS. 3A and 3B, a temperature sensor or miniature thermometer, which would send a signal to the microcontroller representing the temperature at any specific time; the microcontroller would then make the requisite frequency correction (using an equation, which can be based on empirical or theoretical relationships, relating frequency and temperature drift) to the carrier frequency transmitted to the varactor of the oscillator. This correction is applied directly to the varactor in real time to reduce SAW oscillator frequency instability based upon temperature changes to about 5 ppm.

The range of oscillators commercially available include crystal oscillators (XO) with no temperature compensation, XO with PLL stabilization, TCXO (temperature compensated through thermister controlled feedback), MCXO (microcontroller based stabilization) and OCXO (oven based stabilization), giving progressively better frequency stability against temperature variations. For example the OCXO is an oven compensated XO which has very good performance (e.g., 0.1 ppm); however, it is expensive, large, and uses a relatively large amount of power (e.g., 1 W), and is slow to respond to spurious temperature changes, such as warmup transients.

Both of the temperature and vibration based frequency corrections discussed above are intended to enhance the RF link by reducing the hardware, power and processing complexity of the receiver.

An alternative design of the transmitter suitable for use in the present invention is illustrated in FIG. 3B, which incorporates a VC-TCXO (voltage controlled, temperature controlled, crystal oscillator) and a phase locked loop (PLL) synthesizer. While this embodiment should extend performance of the transmitter to lower bps rates (such as less than 5 bps), it involves somewhat larger, more costly, and increased power.

Figure 5:
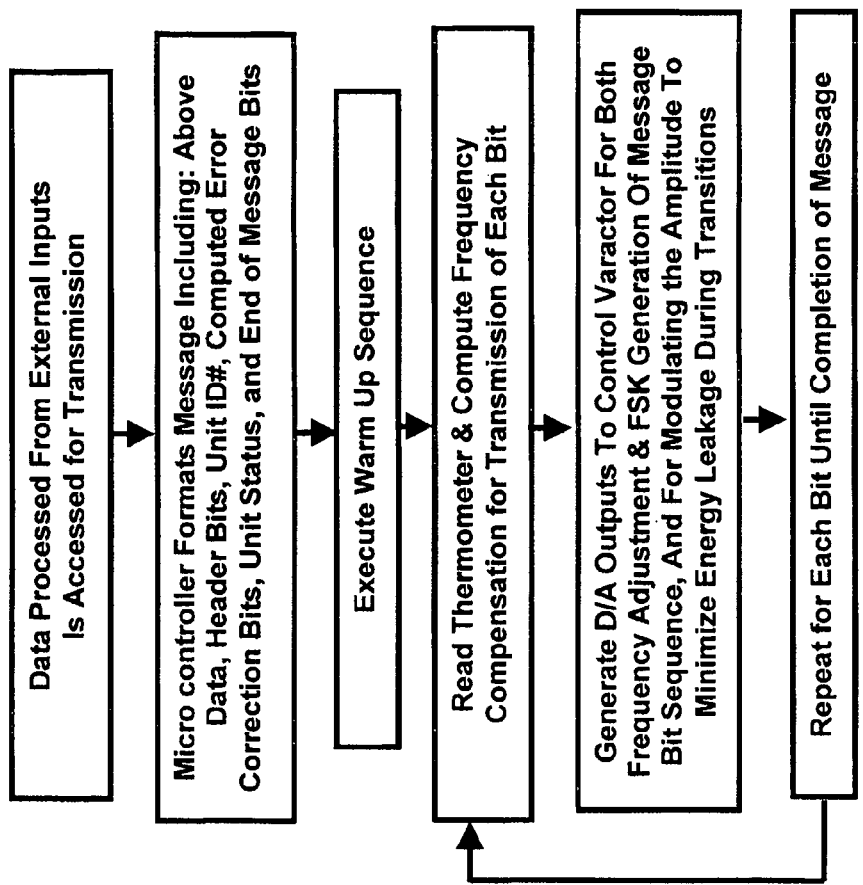
FIG. 5 is a chart indicating the operational flow of a transmitter suitable for use in the present invention.

FIG. 5 is a chart indicating the operational flow of the transmitter, using a SAW resonator and temperature sensor. First, data stored or computed in the shared microcontroller (unit ID, battery status, etc.), or data derived from external inputs (acoustic detection, classification, image compression, etc.) using the shared microcontroller (or a separate processor), is formatted. A typical formatted message could contain 6 header bits, 6 computed error correction bits, 10 Unit ID bits, 16 message bits, and 4 end of the message bits totaling 42 bits, and be transmitted at 10-30 bps. Next, the oscillator and amplifier are warmed up, computation of the real-time thermometer based frequency corrections are initiated, one D/A output controls the frequency drift compensation and the FSK frequency shifting in order to generate a bit sequence using two precisely spaced shifts of the carrier. A second D/A output controls the modulation of the power amplifier to smooth the transition between the frequencies to minimize energy leakage outside the desired bands. This sequence is repeated for each bit of the message. The preferred carrier frequency is 915 MHz or 2.4 GHz, primarily because of availability of low cost quality components.

Receiver

The receiver suitable for use with the present invention preferably detects, tracks, extracts, and decodes the transmitted low data rate RF signal. These functions are preferably performed using the minimum receiver BW required to encompass the majority of the transmitted signal BW, in order to minimize the noise floor; this, in turn, maximizes the propagation range possible for the link.

The noise floor drops in proportion to the reduction in the link processing BW, and has a direct relationship with the propagation range, as shown in the following equations. The maximum propagation range $R_{Max}$ for which an RF signal transmitted at power $P_T$, frequency F, and bandwidth BW can be detected at a signal to noise ratio of S/N by a receiver having a noise figure of NF and a bandwidth BW in an attenuating environment modeled as $1/R^N$, is given by the following formula:

$$R_{Max}(\text{ft})=10 \exp [\{P_T-P_{Min}+38-20 \log F(\text{MHz})\}/10N].$$

Where $P_{Min}$, the minimum detectable signal power (at room temperature) with these parameters, is determined by:

$$P_{Min}=10 \log [4(10^{-18})(BW)(NF)(S/N)]\text{dBm}$$

For example, from the formulas above, the free space propagation (N=2) range for a 1 mW, 2.4 GHz RF transmission having a data rate of 10 bps, and a BW of 10 Hz, and being detected using a receiver with NF=5, S/N=20, and BW=100 kHz (the minimum detectable signal of −104 dBm) is approximately 1 mile using conventional receivers. However, the individual bit detection approach used in this invention, capable of detecting with a BW of 20 Hz versus 100 kHz in this example, the calculation gives about 70 miles for the estimated propagation range, using the same transmit power. If the transmit carrier frequency drifts by ±5 ppm over the outdoor temperature range, and the message is being transmitted using a 2.4 GHz carrier, there is the potential for the carrier frequency to be any where in the 2.4 GHz±12 kHz range. In addition there can be power-up temperature transients of hundreds of Hz per second drift, as well as vibration and Doppler induced variations of tens to hundreds of Hz over the duration of the message.

Typical transceiver chipsets which address outdoor RF communications have their receiver BW set in the 75-150 kHz range for a number of reasons, including transmitter and receiver instabilities, achieving higher data rates, and design performance issues. The receiver of this invention is designed to achieve a dramatically lower detection BW by incorporating features that effectively search for the presence of individual bits (using the known transmit bandwidth) over the frequency band containing these potential carrier offsets and instabilities. The receiver automatically determines whether a detected series of bits form a message and, if so, extracts the bits containing the message. This innovative processing greatly reduces the receiver detection noise bandwidth, thereby achieving the longer propagation ranges at the same transmit power.

To achieve the above narrow bandwidth detection capability, the RF receiver first limits the incoming RF energy using a passive SAW filter with a band-pass of about ±0.5 MHz. Then, through conventional analog processing steps including heterodyning and crystal band pass filtering, a frequency band sufficiently wide to encompass the signal's potential frequency shifts, is isolated, A/D converted, and a continuous time sequence of spectrums (spectrogram) covering a selected band surrounding 2.4 GHz (for example, ±20 kHz) is computed. This spectrogram is computed to have sufficient time and frequency resolution to adequately synchronize with the incoming message bit data rate, and be confined to a single spectrogram frequency bin (frequency bin interpolation is utilized to increase resolution).

Next, a series of digital processing steps is performed on each spectrogram. The spectrogram consists of a continuous series of spectrums (for example, each containing 1,000 10 Hz spaced frequency bins computed every 0.05 sec), computed in real-time. This data is analyzed using a digital signal processor, to achieve detection, tracking, and narrow band extraction of the messages that may be present anywhere in the spectrogram. Messages are detected as a string of bits that sufficiently exceed the background noise level. If a message has a carrier that is stable, it will appear as a straight line perpendicular to the spectrogram frequency axis; if it is rapidly drifting in frequency because of a temperature transient, the message may appear as a slanted curved line on the spectrogram, and if it contains frequency modulations due to Doppler effects, it may consist of a wiggle-like curve throughout its duration.

In order to detect such a wide range of signal frequency time paths in the spectrogram, while maintaining the narrow bandwidth consistent with the message bandwidth, specialized processing is required, including detection and tracking algorithms which are used for detecting bits in the spectrogram that have signal/noise ratios sufficiently high to trigger a candidate bit response, and the tracking of a series of such bits to establish if a candidate message (e.g., 42 such bits) is present. Once a candidate message and its frequency time path is identified, this information can be used to extract the bit sequence directly from the spectrogram. Alternatively, the original time series data (corresponding to the candidate message) may be extracted in the near vicinity of the detected F-T paths (frequency-time paths) of the stored buffered time domain signal, allowing enhanced analysis for identification and extraction of the bits and message. The preferred approach for detecting and determining F-T paths of messages having an unstable carrier frequency requires development of a customized version of dynamic programming algorithms which can be used to scan all possible starting points of the message, and all possible paths of a known duration. This method allows cost functions to be applied to detecting candidate messages based on to what degree a given path distinguishes itself from the background (e.g. the maximum sum energy path), and contains constraints on how rapidly the carrier is allowed to change frequency each time increment. The preferred embodiment algorithm will be based on the maximum spectral power sum path in its search region, but other measures can be selected. This processing will also establish the statistical significance of the find and provide the detailed F-T path coordinates in order to extract the individual bits of the message, or extract the time domain message signal from the buffered data for further processing (for example, by linear predictive filtering, optimum BP filtering, and statistical detection methods).

Dynamic programming algorithms (based on calculus of variations methods) stand alone in their ability to perform the task of detecting the maximum energy F-T path extremely rapidly, and will provide this near real-time capability (this general approach has had a major impact in speech recognition, error correction codes, etc.) The algorithm is also capable of performing researches for the presence of weaker messages, once the first detected message has been removed.

The second approach to retrieving the individual bits that may offer advantages is to utilize the computed F-T path coordinates of a candidate message and employ digital heterodyne processing to extract this portion from the buffered time domain signal and remove the frequency variation in one step; this is then followed by use of an automatically designed optimally designed low pass filter and a bit detection algorithm. A time domain signal buffer may be required to allow completion of this detection process in real-time by allowing the section of the spectrogram containing the message to be recovered for the extraction and decoding process. The time series may also be buffered to allow this processing to proceed with the complete phase and amplitude information of the message. Finally, in an advanced version, an analysis of the signal and noise characteristics will automatically be made to determine optimal processing parameters to further enhance the signal to noise ratio. At this point the bits can be recovered, error correction checks applied, and the message decoded.

Figure 6:
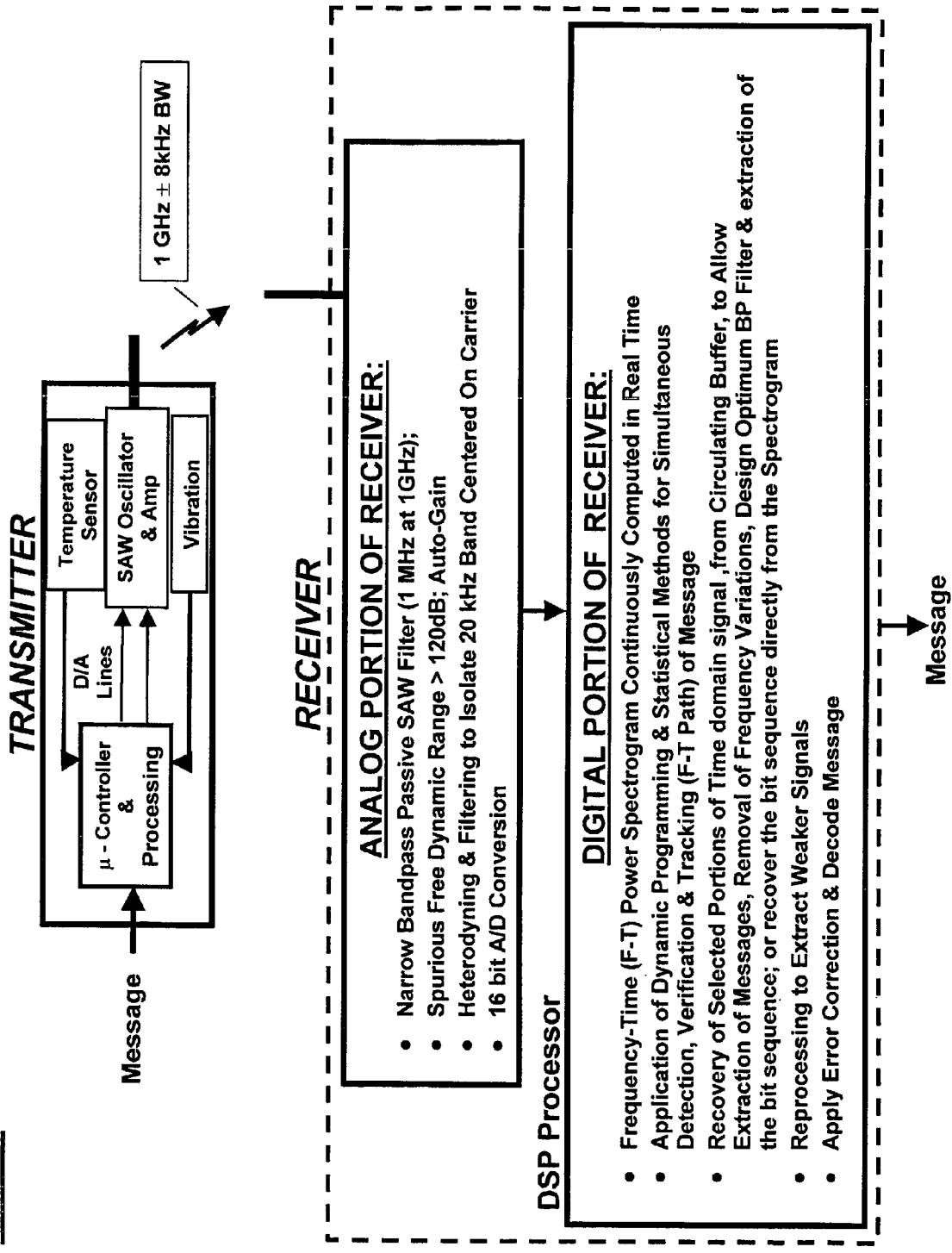
FIG. 6 is an overview of the transmitter and receiver suitable for use in the present invention.

An example of the present invention is shown in FIG. 6, which gives an overview of the invention, indicating key components and functions of the ultra-narrow bandwidth RF transmitter and receiver. In this embodiment, the transmitter is transmitting a message using FSK modulation with a 1 GHz carrier, having an offset uncertainty corresponding to ±8 ppm (±8 kHz), and potentially with additional tens to thousands of Hz variations from vibration, Doppler, and temperature transients, about the offset carrier frequency. The receiver of the present invention then automatically and reliably detects and decodes these unstable messages, using minimum bandwidth processing.

Figure 7:
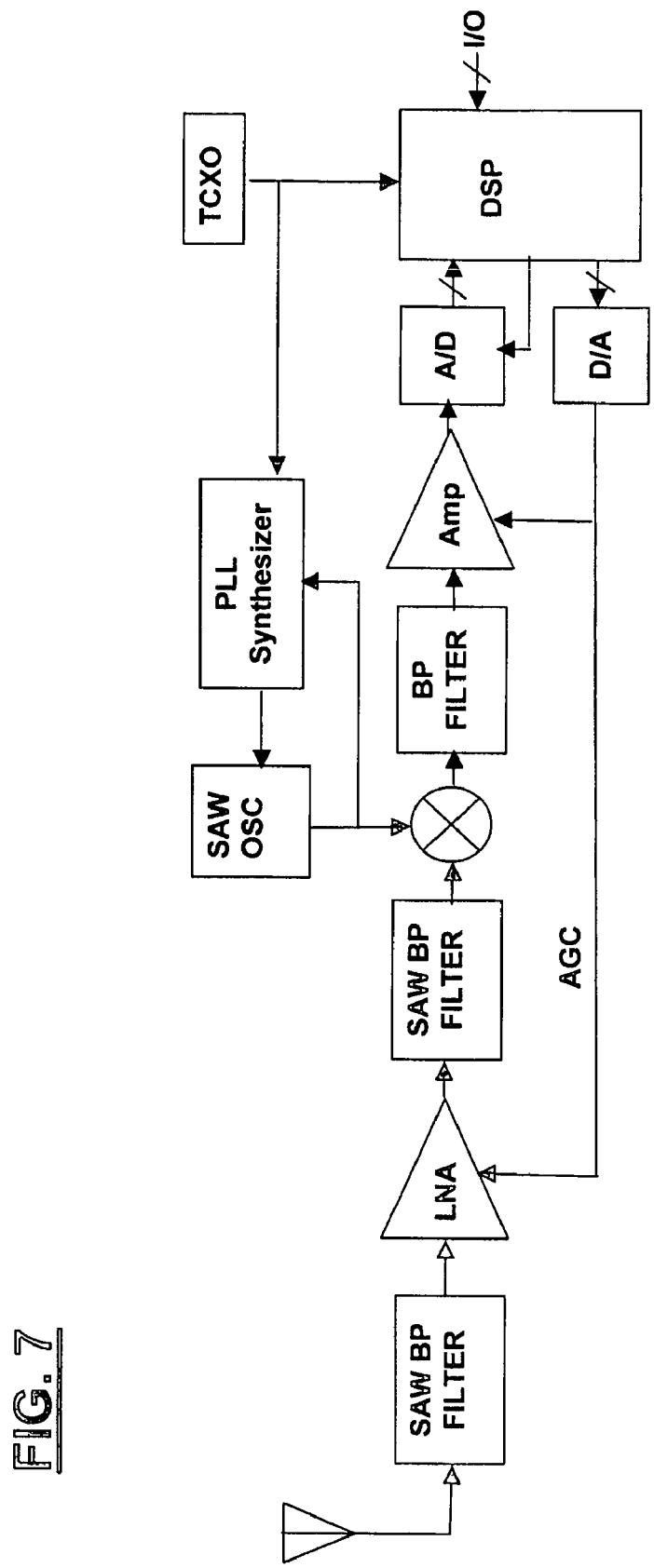
FIG. 7 is a circuit drawing of an embodiment of the receiver suitable for use in the present invention.

The receiver shown in FIG. 7 comprises an analog portion and a digital portion. The analog portion passively band-passes RF signals using an antenna and a SAW band-pass filter, set to band-pass within ±500 kHz of 1 GHz, with an insertion loss of about 3 dB, to eliminate out-of-band interference and prevent generation of inter-modulation products. Next, as seen in more detail in FIG. 7, the signal passes through a low noise amplifier, followed by a second SAW band-pass filter. At this point, conventional heterodyning and band-pass filtering, and/or crystal oscillator bandpass filters, can be used to isolate the 16 kHz band around the baseband shifted carrier frequency. This is then amplified, low pass filtered at 16 kHz, and digitized at 60 kHz using a 16 bit digitizer (e.g., 96 dB dynamic range), which gives a data rate of about 0.96 Mbps. This data is inputted to the digital signal processor (DSP) to detect and decode the messages using a bandwidth that is as close as possible to the minimum required by the data rate.

The digital processing of the DSP comprises the following key steps:
 a) Continuous generation of a real-time Frequency-Time (F-T) spectrogram, containing all transmitted signals;
 b) Detection and F-T tracking of candidate messages using the spectrogram data;
 c) (i) Extracting signal data in the vicinity of the detected F-T path, from a circulating time domain signal buffer, and performing enhanced time domain processing for detection of the individual message bits; or
    (ii) Performing the individual message bit detection analysis directly on the spectrogram signal and noise data; and
 d) Performing bit extraction, error correction, and decoding of the messages.

Figure 8:
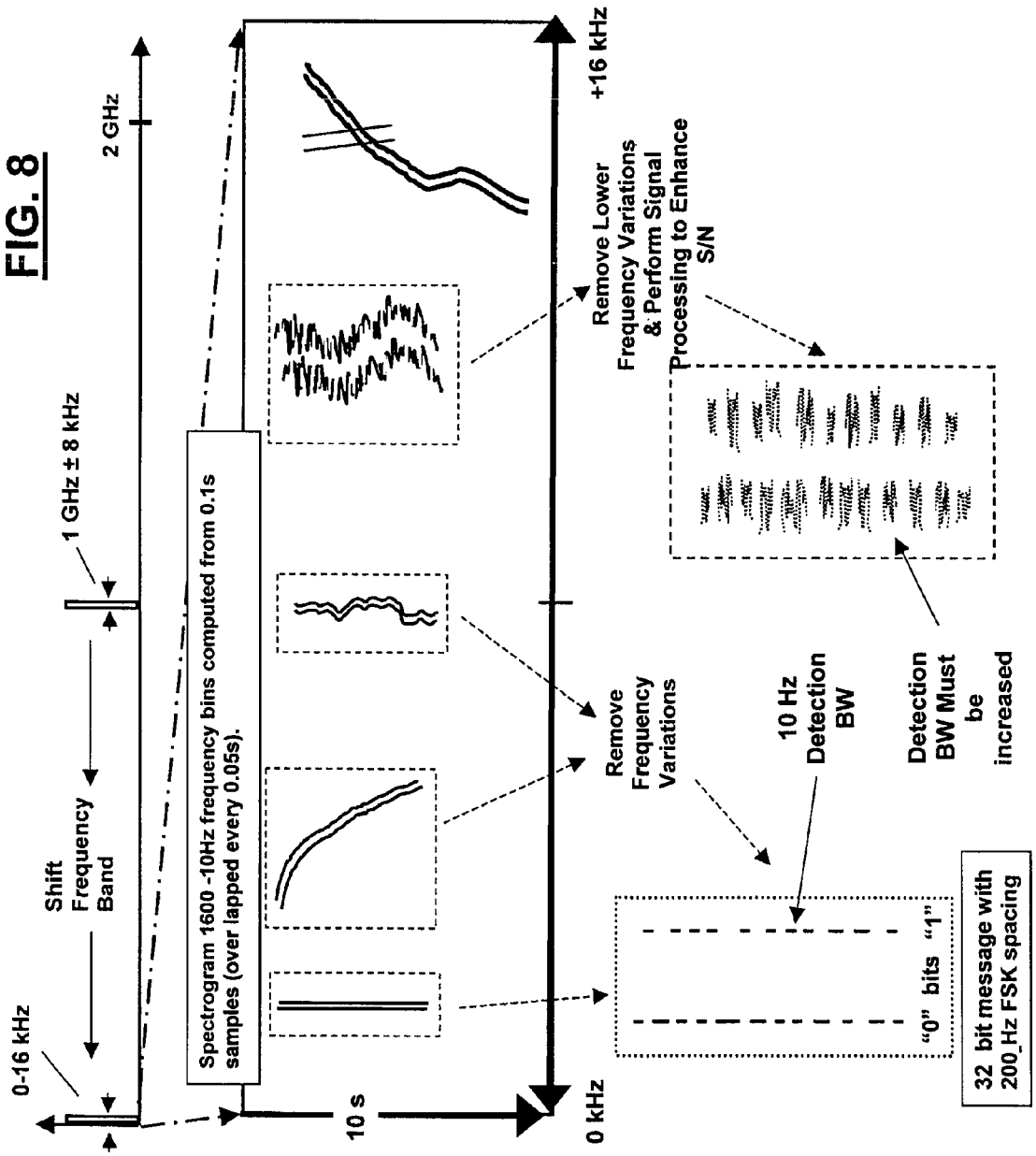
FIG. 8 is an illustration relating to suitable digital processing means for use in the present invention.

Continuing with this example, FIG. 8 illustrates this digital processing. At the top, an RF spectrum covering the 0-2 GHz range is depicted, with the carrier of the transmitted signal being shown as 1 GHz, with an uncertainty of ±8 kHz corresponding to a ±8 ppm frequency instability over the −40 to +90 C temperature range. This is based on the assumption that the transmitter comprises a SAW oscillator having ±100 ppm frequency instability, compensated through thermometer-based adjustments to ≦±8 ppm. This band is shown expanded as a frequency-time spectrogram, which covers the 0-16 kHz range over a span of 10 seconds (shown on the vertical axis).

If the data rate of the transmitter is set at 10 bps, each bit having duration of 0.1 s, a sample rate of 40,960 sps is necessary to obtain 4,096 samples in 0.1 s. A 4096 FFT will in turn give 2,048 10 Hz frequency bins, of which the first 1,600 (covering 16,000 Hz) can be used, and still have room for an anti-alias filter to remove higher frequency unwanted components that can leak (alias) into the computation. This computation must be done at least 20 times per second (achieving 50% time overlap) to achieve reasonable synchronization with the bit stream. The DSP processor may zero-fill to compute an interpolated FFT of 8,192 pts., to achieve higher frequency bin resolution to help in frequency alignment.

On the left side of the spectrogram an ideal situation is depicted in which the carrier frequency has no time dependent frequency variation, but has undergone a considerable offset from the center of the band. Note that this is FSK modulation which means there are pulses at one frequency for the "0" bits, and pulses at a second frequency for the "1" bits; for example, a frequency shift spacing of 200 Hz may be selected for many scenarios. In the expanded view on the bottom left of the figure, two streams of bits are shown, which form a complement. These two streams of bits can be detected directly from the spectrogram in most cases, or be extracted from the buffered time domain data using the F-T path determined from the spectrogram; further processing can be performed on the time domain data potentially allowing extraction of individual bits in lower signal to noise situations. Thus, when a "1" bit is transmitted, the "0" bit on the second frequency is has no transmitted signal energy. In this way FSK detection can utilize a ratio detector and reduce effects of interference. Each stream of bits can be independently detected in this case using a narrow bandwidth detector, and then crosschecked with the second frequency results to insure they are complementary. By requiring all messages to have the same number of bits (and time duration), further verification and rejection of false detections is achieved.

In the adjacent two examples, the carrier is rapidly increasing in frequency due to Doppler shifts or a temperature warm-up transient. In this case, processing must be incorporated to detect the candidate message, determine its F-T path, extract this message from the buffered time domain signal, remove the frequency variations and then utilize a narrow band detection method to extract the bits (or perform this extraction directly from the spectrogram data).

The fourth example on the right depicts a situation in which rapid Doppler shift changes (or vibration) are causing frequency broadening of the bits. In this case as shown below, the lower frequency components of the traces can be removed and enhanced processing in the frequency or time domain (from extracted buffered data) can be used to enhance extraction of the message bit patterns.

On the far right of the spectrogram is depicted a situation in which a strong frequency varying signal is crossed by a lower amplitude signal. For these cases the processing is designed to extract the stronger signal and make a second pass to extract the weaker one.

A simpler embodiment is possible when the received RF carrier stability is sufficient to allow dividing up the spectrogram into multiple overlapping frequency bands, sufficiently wide to contain the maximum instability. In this way a DSP processor can treat each band as a separate receiver, to be monitored for signal detection and extraction of the bits, using the signals time series or spectrogram as input.

The preferred algorithm to be employed for detecting and determining the F-T paths of messages having an unstable carrier frequency, is shown in FIG. 9. This dynamic programming based algorithm allows one to effectively search all paths, from prescribed starting points, through a matrix of numbers and identify the maximum sum path of a prescribed length. In this application the matrix of numbers is the spectrogram RF power mapped over a region of F-T space. A simple example of the method is shown using the data matrix on the left. In this case all paths that originate on the bottom row are considered, and can change columns by 0 or ±1 each row. The algorithm is extremely efficient in that it effectively solves a "calculus of variation problem" which provides the maximum sum path without actually solving for all possible paths. It basically performs local calculations, which are tabulated in the Merit Matrix on the right to provide a global optimal solution.

The algorithm involves the following steps:

1. Initiate the process by computing the sum of each cell in the next to last row (6,i) of the data matrix, with the maximum of the cells (7,i), (7,i−1), and (7,i+1) below (the local maximum). Enter the sum into the corresponding cell (6,i) of the merit matrix, along with the column number from which the maximum was selected.

2. Continue the process by computing the sum of each cell (5,i) in the data matrix, with the maximum of the cells (6,i), (6,i−1), and 6,i+1) of the merit matrix, and enter the sums into cells (5,i) of the merit matrix along with the column number from which the matrix was selected.

3. Continue this process until the merit matrix is complete. The maximum of the top row indicates the starting point of the maximum sum path. The path index in the maximum cell allows one to determine the point of the maximum path on the row below, and this process can be continued to reconstruct the entire maximum sum path.

The maximum sum path is provided by the procedure and that for this example, the procedure involves approximately n×m×3 operations (with n and m being the number of rows and columns respectively). A brute force procedure, in which each possible path is examined, would involve approximately $n \times 3^m$ operations. For a 1000×1000 data matrix, the Dynamic Programming algorithm involves $3 \times 10^6$ operations verses $10^{480}$ operations that would be required using the brute force method ( ). At $10^{-7}$ seconds per operation (using a computer), the Dynamic Programming method would take 0.3 seconds, whereas a brute force approach would take $3 \times 10^{472}$ years.

Since this algorithm gives the maximum sum path, and there is always a maximum, it is necessary to determine whether this path has a very low probability of having originated from the background noise. This can be accomplished several ways including multiple re-runs of the algorithm after randomizing the matrix cells, or more simply computing estimates of the background noise and using statistical means, both of which can be an on going updating process for characterizing the background activity.

Once detection has been made of a candidate message, the pertinent region of the spectrogram can be extracted from a circulating time domain memory buffer for further analysis; or analysis is completed using the spectrogram data. The time domain data contains both signal amplitude and phase data for all frequency components, in contrast to the spectrogram data has only spectral amplitude data, thereby offering the possibility of enhanced performance at a greater effort. The RF link can standardize on a few message lengths, data rates, and FSK frequency spacings, which provide constraints helping to identify messages from the background. Once the receiver has identified the time-frequency path of the "0" and "1" bits, the frequency variations may be removed through reverse heterodyning (e.g., canceling the F-T variations) in the case in which the buffered time domain data is utilized, and design a narrow band pass filter to enhance the signal to noise of the bit pattern which, as illustrated in FIG. 10, can be individually identified through a ratio-based FSK detection. At this point the error correction bits can be used to correct one or more error bits (depending on the version used) and the message is decoded. The detected signal may now be removed, and the analysis repeated for possible weaker signals being present in the spectrogram.

It is noted that terms like "preferably" and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the term "device" is utilized herein to represent a combination of components and individual components, regardless of whether the components are combined with other components.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Having described the invention in detail and by reference to specific embodiments thereof, it will be apparent that modifications and variations are possible without departing from the scope of the invention defined in the appended claims.

What is claimed is:

1. An ultra-narrow bandwidth digital RF communication system comprising:
   at lease one sensor designed and configured to acquire information, and generate a signal containing said information,
   at least one transmitter configured to transmit ultra-narrow bandwidth digital RF radio signals, wherein
      the transmitter is designed and configured to receive and process the sensor-generated signal,
      the RF radio signals comprise a sequence of message bits relating to the sensed conditions, having a data rate in the range of about 1-100 bits per second, resulting in a transmitter carrier frequency having an ultra-narrow frequency bandwidth in the range of 1-100 Hz, and
      the RF radio signals are subjected to interfering processes based upon channel conditions that could induce carrier frequency shifts and instabilities in the range of 2-1000 times larger than the message bandwidth,
   a receiver configured to receive the RF radio signals using a detection bandwidth of about the same width as the signal bandwidth, wherein the receiver is further configured to
      isolate the frequency band, centered on the carrier frequency, which will contain the transmitted signals,
      convert the signals to digital data,
      input the digital data into a digital signal processor to detect, track, extract and decode the message, wherein the digital signal processor is designed and configured to:
         generate a frequency-time spectrogram of the digital data,
         analyze the spectrogram using detection and tracking algorithms based upon dynamic programming theories, to detect message bits in the spectrogram and track a series of such bits to determine the frequency-time path of the message,
         extract the bits present in the spectrogram, based upon the detected bits and frequency-time path of the bit-series, and
         decode the message.

2. The communication system of claim 1, wherein
   the transmitter is further designed and configured to generate messages relating to said sensed conditions for transmission by the transmitter as RF radio signals, and
   the RF radio signals shift between two frequencies using frequency shift keying transmission.

3. The communication system of claim 1, wherein the transmitter further comprises a temperature sensor, and wherein the transmitter is configured to temperature stabilize the carrier frequency of the RF radio signals to be transmitted based upon measurements from the temperature sensor.

4. The communication system of claim 3, wherein the transmitter further compromises two digital to analog output controls, wherein one output control shifts the carrier frequency based upon measurements from the temperature sensor, and one output control modulates the RF radio signals by frequency shift modulation, and smoothes the transition between frequencies to minimize energy leakage.

5. The communication system of claim 1, wherein
   the transmitter is designed and configured to transmit a defined number of bits in a message, at one or more specific data rates, and wherein the RF radio signal has a defined frequency shift modulation spacing, and
   the receiver is designed and configured to detect messages comprising the defined number of bits, at the one or more specific data rates, having the defined frequency shift modulation spacing.

6. The communication system of claim 1, wherein the receiver is further configured to shift the carrier frequency of the received signals and then isolate the frequency bandwidth of the shifted, received signals, centered on the carrier frequency, before converting the signals to digital data.

7. The communication system of claim 1, wherein the digital signal processor of the receiver is further designed and configured to
   generate a buffered time-domain signal from the digital data, said buffered signal containing both amplitude and phase data for all frequency components, and
   perform the bit extraction by extracting the message bits from the buffered time domain signal, using the detected and tracked frequency-time path of the bit-series, applying narrow band detection methods.

8. The system of claim 7, wherein the buffered time-domain signal is stored in a circulating time domain memory buffer.

9. The system of claim 7, wherein the digital signal processor is further designed and configured to remove lower frequency components from the buffered time-domain signal prior to applying the narrow band detection methods.

10. The communication system of claim 7, wherein the digital signal processor is further designed and configured to remove frequency-time variations in the received RF radio signals by reverse heterodyning, thereby shifting the signal to base-band.

11. The communication system of claim 10, wherein the digital signal processor further comprises a narrow band pass filter to enhance the signal to noise differentiation of the bit pattern prior to detection and extraction of the message bits.

12. The communication system of claim 1, wherein the digital signal processor, after extracting the message bits present in the spectrogram, is further configured to analyze the spectrogram using detection and tracking algorithms based upon dynamic programming theories, to detect additional message bits in the spectrogram and track a series of such bits to detect and track the bits and frequency-time path of the bit-series of another message.

13. The communication system of claim 1, wherein the digital signal processor is designed and configured to analyze the spectrogram, detect message bits and determine the frequency-time path of the message by generating one or more matrices of the spectral power of the spectrogram, and tabulating therefrom a merit matrix, from which the bits and frequency-time path of the bit-series may be detected and tracked.

14. The communications system of claim 13, wherein the digital signal processor is further designed and configured to compute one or more measures from the merit matrix to detect and track the frequency-time path of a bit-series.

15. The communication system of claim 14, wherein a measure computed from the merit matrix is the maximum sum path of the message power.

16. The communications system of claim 13, wherein the measures are calculated once, and then confirmed by recalculation.

17. The communication system of claim 1, wherein the receiver is further configured to
limit the incoming out of signal band RF energy of the received RF radio signal using a passive SAW filter with a band-pass of about +/−0.5 MHz,
heterodyne the limited signal, and
isolate the frequency bandwidth of the received signals, centered on the carrier frequency, by band pass filtering the heterodyned signal to a frequency band sufficiently wide to encompass the signal's potential frequency shifts.

18. The communication system of claim 1, wherein the digital signal processor is designed and configured to extract the bit sequence directly from the spectrogram.

* * * * *